(12) United States Patent
Miyajima

(10) Patent No.: US 6,430,802 B1
(45) Date of Patent: Aug. 13, 2002

(54) CLEAN BOX, CLEAN TRANSFER METHOD AND APPARATUS THEREFOR

(75) Inventor: Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/294,008

(22) Filed: Apr. 19, 1999

(51) Int. Cl.⁷ .......................... B23Q 3/00; B23P 21/00; B65G 49/07; B65D 85/00

(52) U.S. Cl. .......................... 29/464; 29/468; 29/722; 414/217; 414/939; 206/711

(58) Field of Search .................... 29/464, 468, 722; 414/217, 939; 454/187; 206/710, 711, 454, 832; 220/324, 326

(56) References Cited

U.S. PATENT DOCUMENTS

| | | | | |
|---|---|---|---|---|
| 4,652,135 A | * | 3/1987 | Ono .......................... 356/401 |
| 4,683,761 A | * | 8/1987 | Stock ........................ 73/864.34 |
| 5,080,248 A | * | 1/1992 | Stocchiero .................. 220/232 |
| 5,139,459 A | | 8/1992 | Takahashi et al. |
| 5,316,733 A | * | 5/1994 | Rune et al. .................. 422/104 |
| 5,364,219 A | | 11/1994 | Takahashi et al. |
| 5,730,573 A | | 3/1998 | Masujima et al. |
| 6,168,364 B1 | * | 1/2001 | Miyajima .................. 414/217 |
| 6,199,604 B1 | * | 3/2001 | Miyajima .................... 141/98 |
| 6,338,604 B1 | * | 1/2002 | Okabe et al. ............. 414/217.1 |

FOREIGN PATENT DOCUMENTS

| | | | |
|---|---|---|---|
| JP | 63-28047 | | 2/1988 |
| JP | 7-235580 | | 9/1995 |
| JP | 2525284 | | 5/1996 |
| JP | 9-246351 | | 9/1997 |
| JP | 2722306 | | 11/1997 |
| JP | 10-56050 | | 2/1998 |
| JP | 410056050 | * | 2/1998 |
| JP | 2757102 | | 3/1998 |
| JP | 2137951 | | 8/1998 |
| JP | 10-321695 | | 12/1998 |
| JP | 10-321696 | | 12/1998 |

OTHER PUBLICATIONS

U.S. application No. 09/473,946, fuked /dec, 29, 1999, pending.

* cited by examiner

Primary Examiner—S. Thomas Hughes
Assistant Examiner—John C. Hong
(74) Attorney, Agent, or Firm—Oblon, Spivak, McClelland, Maier & Neustadt, P.C.

(57) ABSTRACT

A clean box has a box body having an aperture in one side surface, an opening/closing lid for hermetically closing the aperture while undergoing vacuum suction to the box body, and a plurality of latches provided on the box body so as to be able to engage the opening/closing lid outside the box body. The latches of the clean box can be unlatched by latch releasing mechanisms from outer and lateral sides of the box body, which are side positions with respect to the side surface having the aperture.

7 Claims, 10 Drawing Sheets

Prior Art

Fig. 10

Prior Art

CLEAN BOX, CLEAN TRANSFER METHOD AND APPARATUS THEREFOR

BACKGROUND OF THE INVENTION

1. Field of the Invention

The present invention relates to a clean box constructed in structure that objects to be transferred, necessary for production processes of semiconductors, electron-device-associated products, optical disks, etc., can be transferred in a clean state containing no contaminants and, particularly, in such structure that the objects to be transferred can carried into or out of the box through a side aperture thereof, and also relates to a clean transfer method and apparatus suitably applicable for transferring this clean box by an OHT (overhead transfer) or the like and connecting the clean box to a clean device.

2. Related Background Art

The inventor of the present invention suggested the clean box of a side open type in Japanese Laid-open Patent Application No. 10-321696 laid open on Dec. 4, 1998) which was also assigned to the assignee of the present invention. Use of this clean box of the side open type presents the following advantage; the objects to be transferred can be carried in and out of the box through the side aperture and waste vertical motion of the objects to be transferred can be eliminated.

Figure 9:
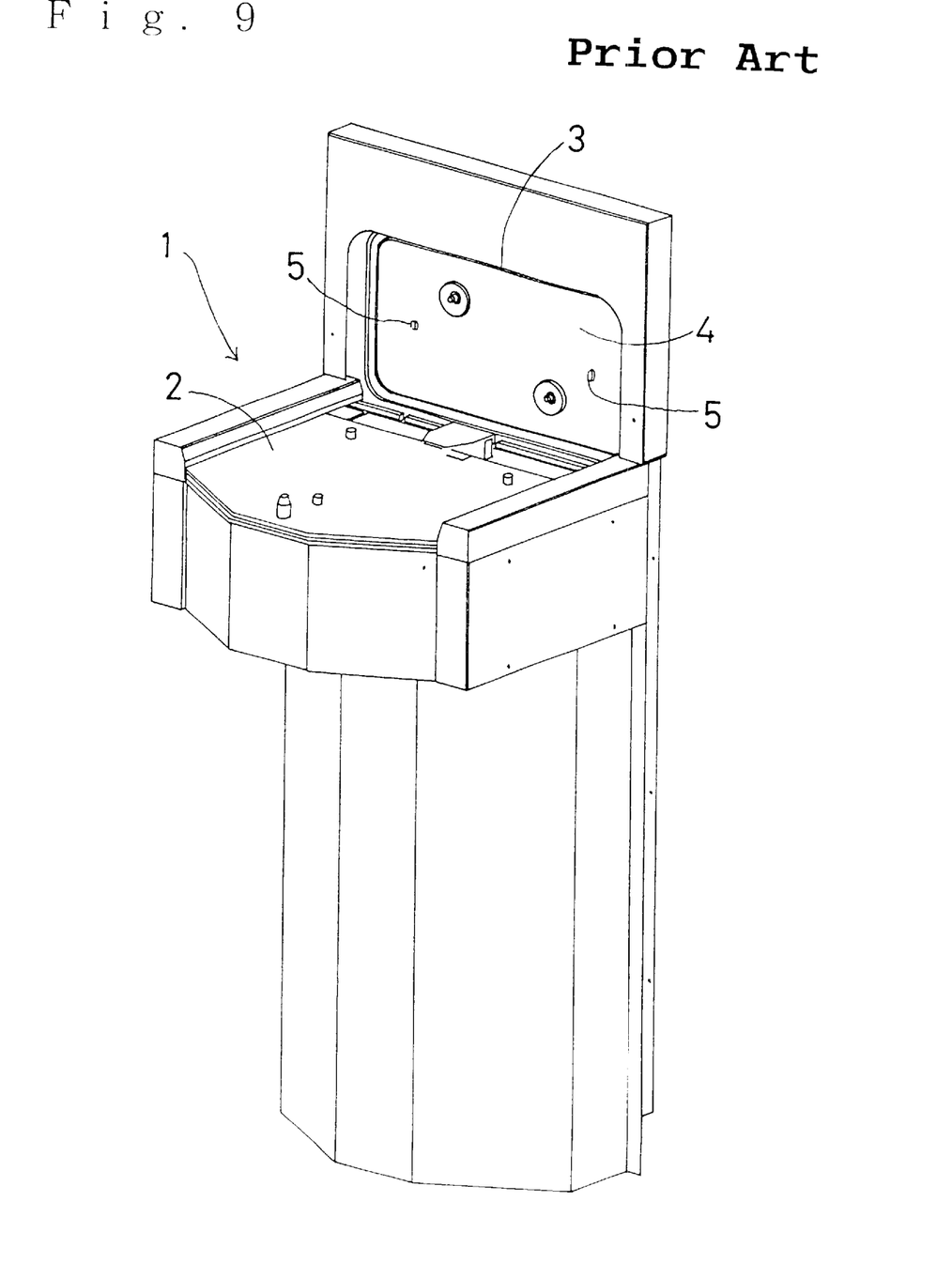
FIG. 9 is a perspective view to show the conventional load port mechanism.
Figure 10:
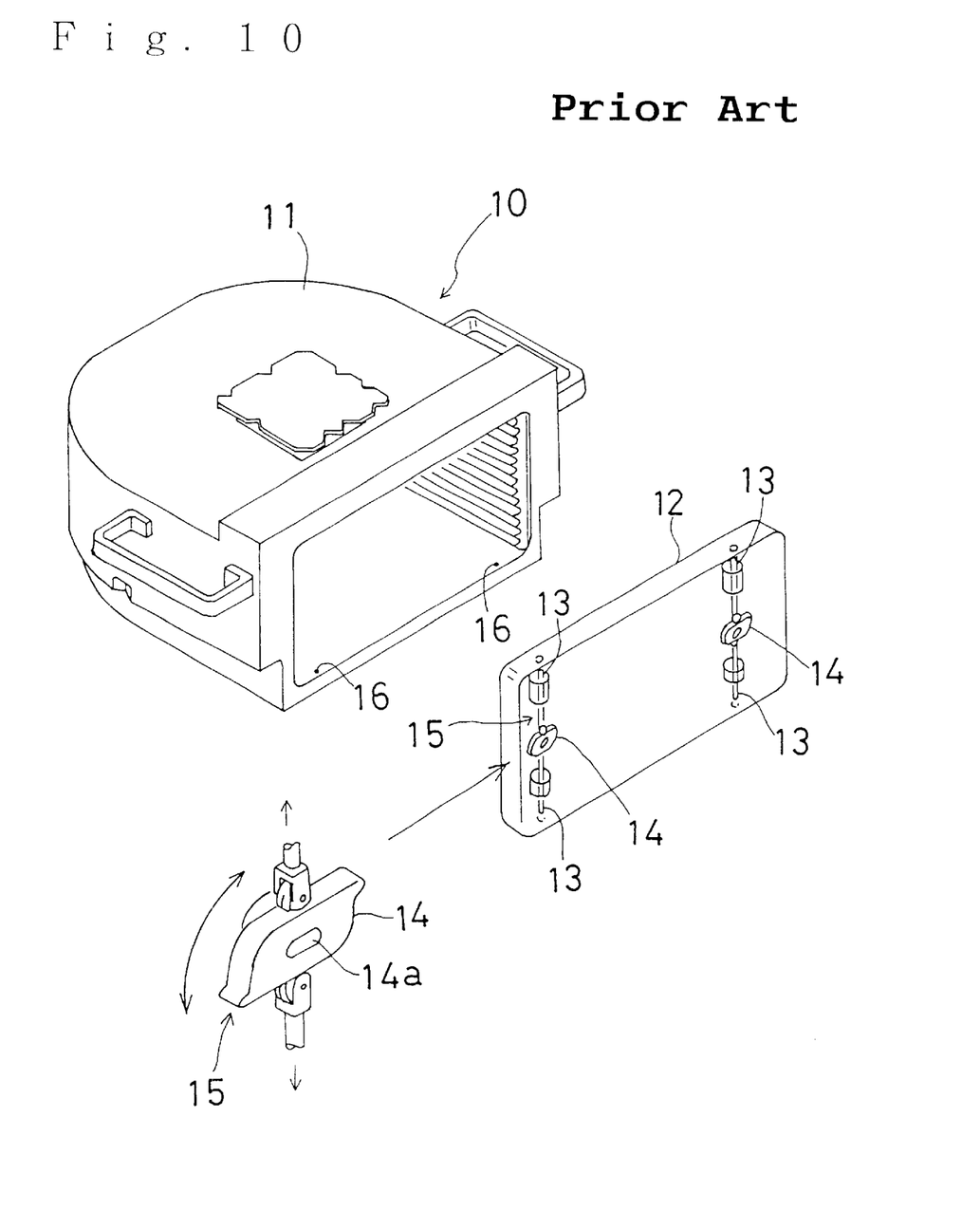
FIG. 10 is an exploded perspective view to show the conventional clean box.

There is a local clean space system for fabrication of semiconductors now under study toward use, which is used as follows; a load port mechanism 1 as illustrated in FIG. 9 is attached to an entrance/exit part of each clean device used in carrying semiconductor wafers into or out of the device, the side open type clean box 10 of a mechanical seal method as illustrated in FIG. 10 is mounted on a load port table 2 of the load port mechanism 1, the table 2 is moved by about 30 mm toward a gate aperture 3 of the load port mechanism 1 to connect an opening/closing lid 12 of the clean box 10 to a gate valve 4 closing the gate aperture 3, mechanical latches of the opening/closing lid 12 are released, and the opening/closing lid 12 and the gate valve 4 are opened simultaneously.

As illustrated in FIG. 10, the clean box 10 is composed of a box body 11 and the opening/closing lid 12, and is provided with latches 15, each being composed of a pair of lock pins 13 and a piece 14 having a key groove 14a and located in the middle, in order to keep the opening/closing lid 12 from being dismounted from the box body 11. Normally, the lock pins 13 are fitted in corresponding holes 16 formed in inside surfaces of the box body 11, so as to make the latches 15 active. When the clean box 10 is connected to the gate valve 4 of the load port mechanism 1, latch keys 5 on the gate valve side come to engage the associated key grooves 14a formed in the pieces 14. Then the latch keys 5 are rotated to release the latches of the opening/closing lid 12.

Incidentally, in the system illustrated in FIG. 9 and FIG. 10, the mechanism for opening or closing the opening/closing lid 12 of the clean box 10 needs to be set on the gate valve 4 side; i.e., the driving section for opening/closing is located in the clean space, which would be the cause of dust.

In cases where the clean box is held and transferred by the OHT installed on a ceiling surface of a plant, there arises another problem that it is very difficult to fit the clean box lowered by the OHT from above into positioning pins on the load port table of the load port mechanism.

SUMMARY OF THE INVENTION

A first object of the present invention is, in view of the above points, to provide a clean box having such structure that latches engaging the outside surface of the opening/closing lid of the clean box can be released from the non-clean space side beside the clean box, so as to prevent production of dust during latching/unlatching of the latches, and also provide a clean transfer method and apparatus using the clean box.

A second object of the present invention is to provide a clean transfer method and apparatus in a configuration suitable for application in which the clean box is moved up and down by the OHT or the like to be connected to a clean device.

The other objects and novel features of the present invention will become apparent in the description of embodiment hereinafter.

In order to accomplish the above objects, a clean box of the present invention is a clean box comprising a box body having an aperture in one side surface; an opening/closing lid for hermetically closing said aperture while undergoing vacuum suction to the box body; and a plurality of latches provided on said box body so as to be able to engage the opening/closing lid outside said box body.

In the clean box, it is desirable that said latches be able to be unlatched from outer and lateral sides of said box body, which are side positions with respect to the side surface having said aperture.

The clean box may have such a configuration that said box body has an annular groove for suction surrounding said aperture in said one side surface and also has an intake/exhaust port in communication with said annular groove for suction in another surface.

The box body may comprise a gas inlet valve and a gas outlet valve.

A clean transfer method of the present invention is a clean transfer method comprising steps of:

preparing a clean box comprising a box body having an aperture in one side surface, an opening/closing lid for hermetically closing said aperture while undergoing vacuum suction to the box body, and a plurality of latches provided on said box body so as to be able to engage the opening/closing lid outside said box body;

preparing a clean device in which a gate aperture formed in a side wall surface is hermetically closed by a gate valve, said clean device comprising box up-and-down guides and latch releasing means on the both sides of said gate aperture outside the side wall surface and further comprising a moving table below said gate aperture and outside said side wall surface;

mounting said clean box on said moving table by lowering said clean box while guiding the clean box by said box up-and-down guides; and hermetically connecting said clean box to said gate aperture by movement of said moving table, thereafter unlatching said latches by said latch releasing means, releasing the vacuum suction of said opening/closing lid to said box body, drawing said opening/closing lid, together with said gate valve, into said clean device to establish communication between an inside space of said clean box and the inside of said clean device, and transferring objects to be transferred between said clean box and said clean device.

A clean transfer apparatus of the present invention is a clean transfer apparatus comprising:

a clean box comprising a box body having an aperture in one side surface, an opening/closing lid for hermetically closing said aperture while undergoing vacuum suction to the box body, and a plurality of latches provided on said box body so as to be able to engage the opening/closing lid outside said box body; and a clean device comprising a gate aperture formed in a side wall surface, a gate valve capable of opening or closing the gate aperture and holding the opening/closing lid of the clean box connected to the gate aperture, box up-and-down guides and latch releasing means provided on the both sides of said gate aperture outside said side wall surface, and a moving table provided below said gate aperture and outside said side wall surface, wherein said box up-and-down guides are guides for guiding said clean box while said clean box is lowered onto said moving table or while said clean box is moved up away from said moving table, and the latch releasing means are means for unlatching said latches from outer and lateral sides of said box body, and wherein in a state in which said clean box is connected to said gate aperture, said latches are unlatched by said latch releasing means, the vacuum suction of said opening/closing lid to said box body is released, and said opening/closing lid, together with said gate valve, is drawn into said clean device to establish communication between an inside space of said clean box and the inside of said clean device.

In the clean transfer apparatus, the box up-and-down guides also serve as covers for covering the latch releasing means in a preferred configuration.

Since the clean box of the present invention is arranged to have the box body having the aperture in one side surface, the opening/closing lid for hermetically closing the aperture while undergoing the vacuum suction to the box body, and the plurality of latches provided on the box body so as to be able to engage the opening/closing lid outside the box body, the clean box has the following advantages; adhesion of the opening/closing lid is firmer than in the conventional simple mechanical seal; the objects to be transferred can be transferred or stored in a sealed state with a clean gas; prevention of a drop of the opening/closing lid is implemented by the compact mechanism; handling of the box is easy.

In the clean transfer method and apparatus of the present invention, the latches on the clean box side can be unlatched from the outside of the clean space, whereby dust and fine particles are prevented from contaminating the clean space with latching/unlatching of the latches. Further, the box up-and-down guides are provided on the both sides of the gate aperture to which the clean box is connected, so that the clean box can be positioned and mounted on the moving table by lowering the clean box while guiding it by the box up-and-down guides.

The clean box according to the present invention has neither evacuation means itself, such as a pump for evacuating the inside of the box, nor transfer means for transferring the box.

DETAILED DESCRIPTION OF THE PREFERRED EMBODIMENT

An embodiment of the clean box and the clean transfer method and apparatus according to the present invention will be described referring to the drawings.

Figure 1:
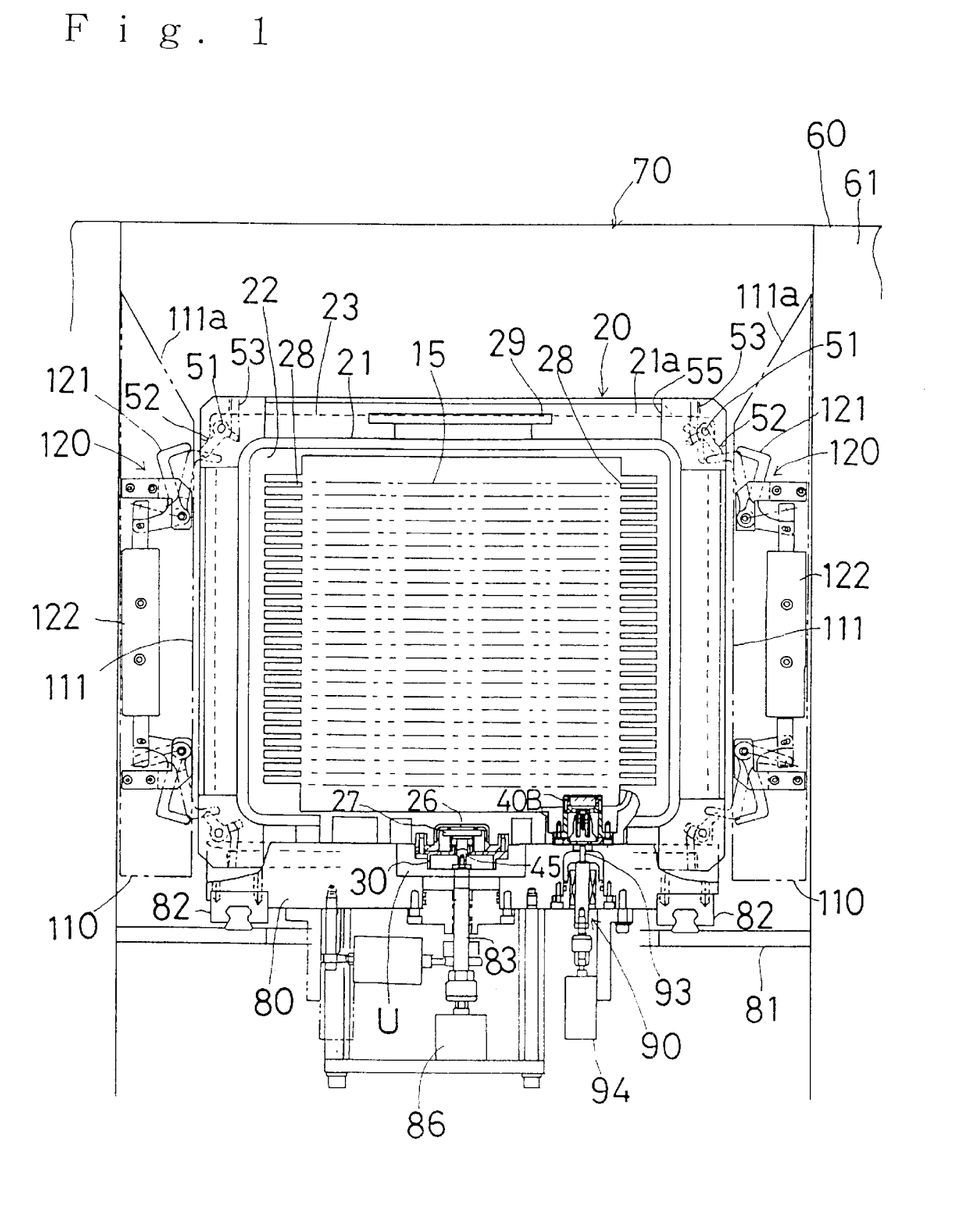
FIG. 1 is a front sectional view of an embodiment of the present invention to show a state in which the clean box is mounted on the load port mechanism.
Figure 2:
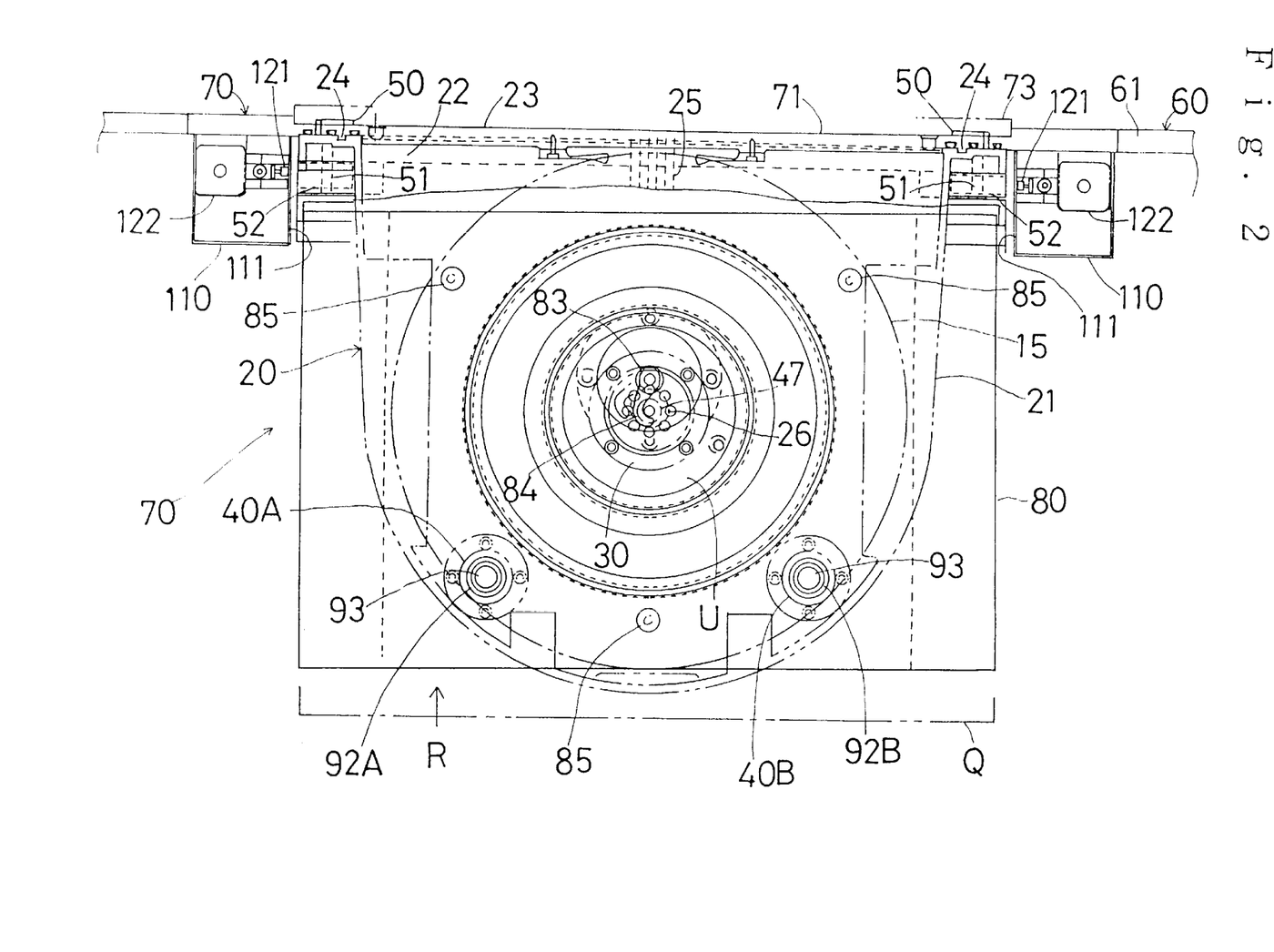
FIG. 2 is a sectional plan view corresponding to FIG. 1.
Figure 3:
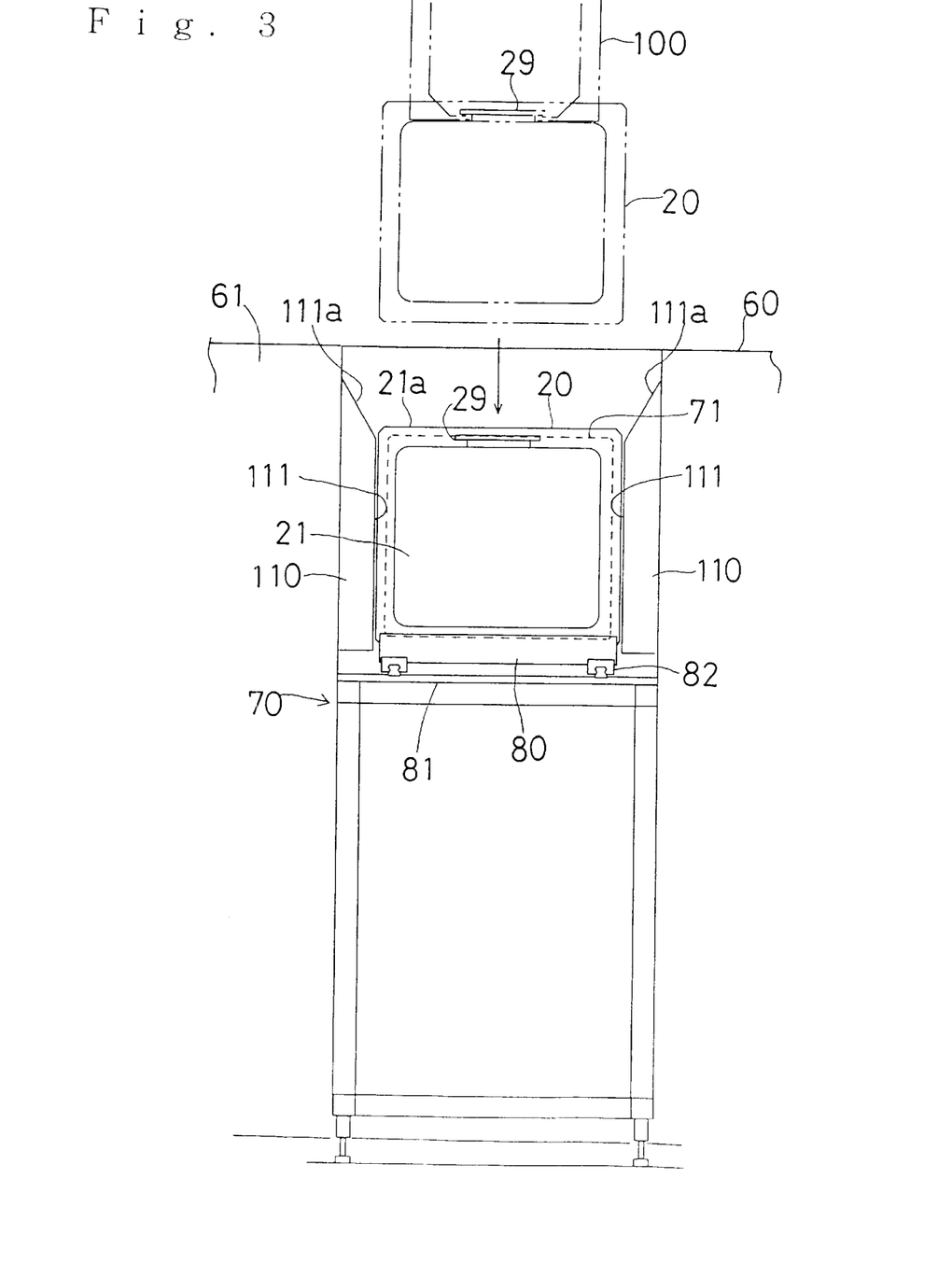
FIG. 3 is a front sectional view to show the overall structure of the embodiment of the present invention.
Figure 4:
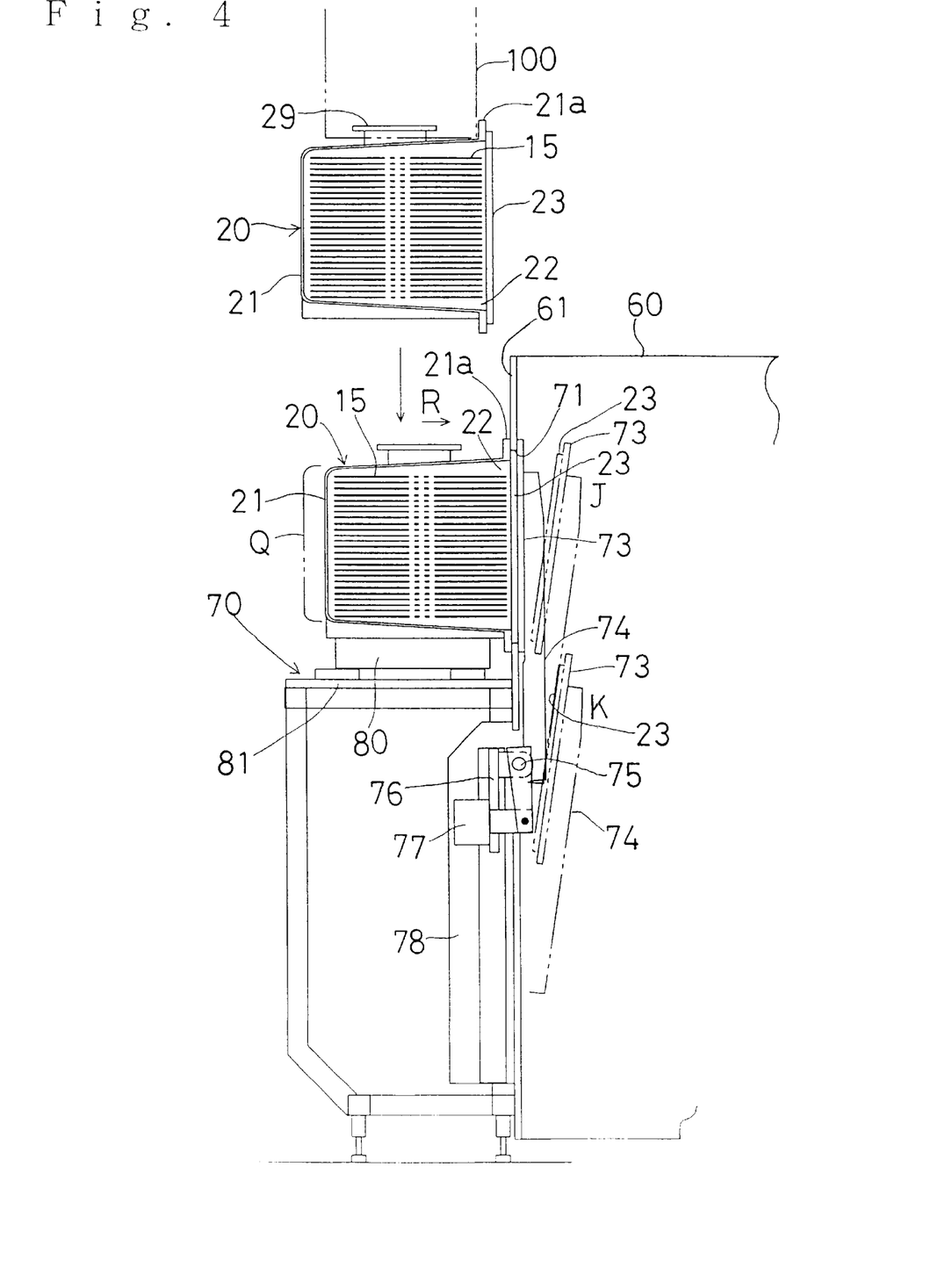
FIG. 4 is a sectional side view of the embodiment corresponding to FIG. 3.
Figure 5:
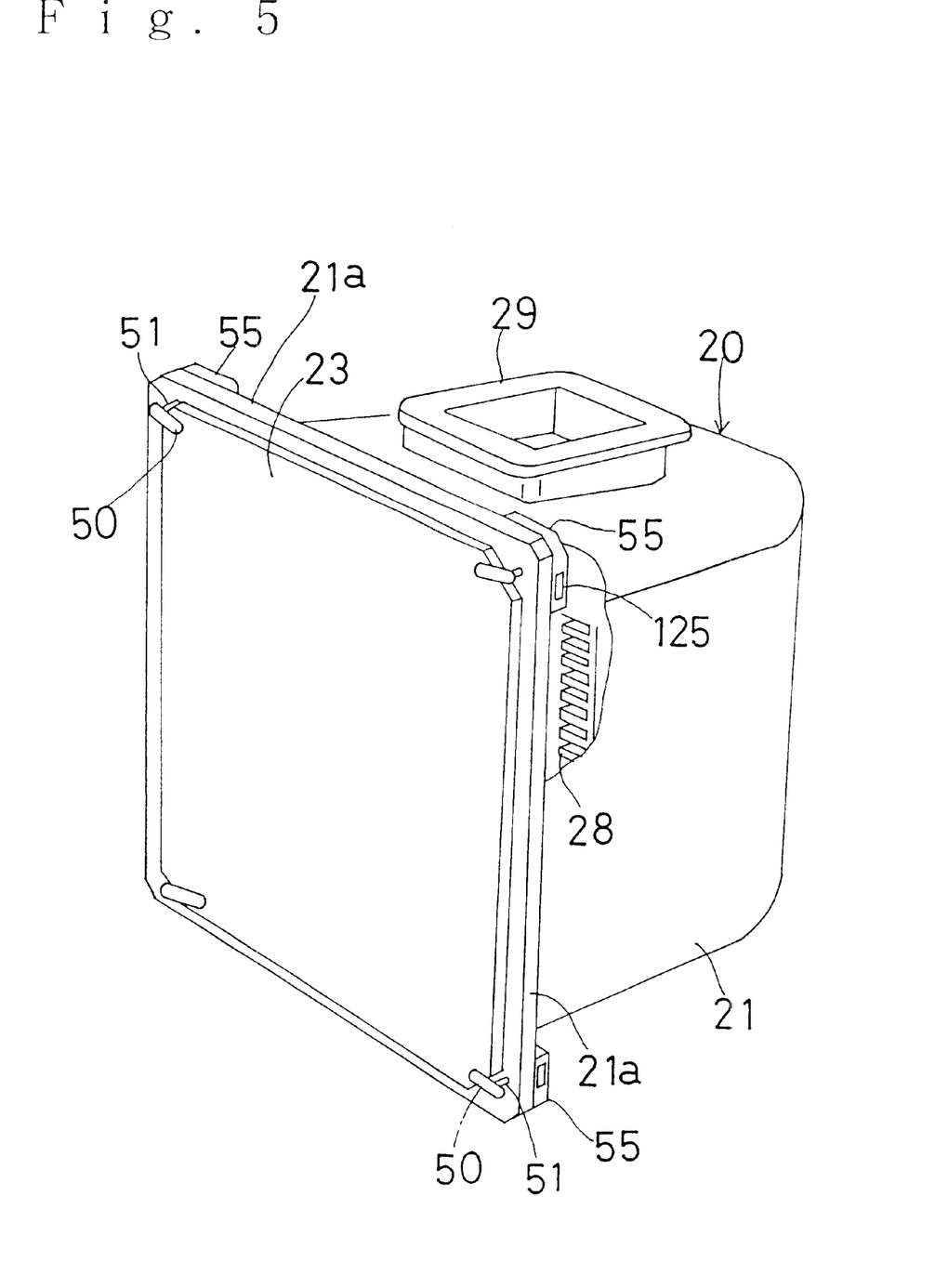
FIG. 5 is a perspective view of the clean box in the embodiment.
Figure 6:
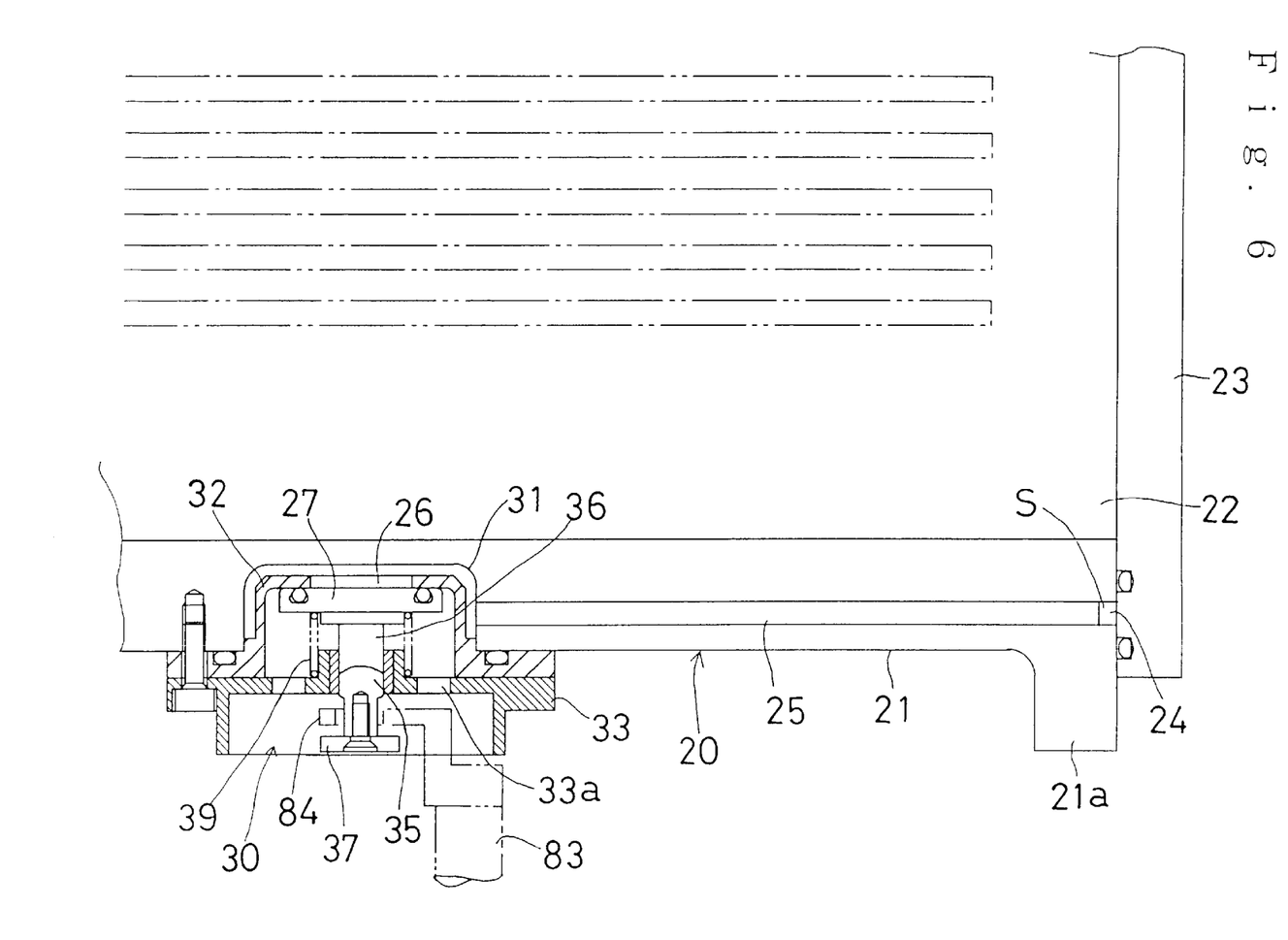
FIG. 6 is an enlarged sectional view of the part around an intake/exhaust port in the bottom of the box body.
Figure 7:
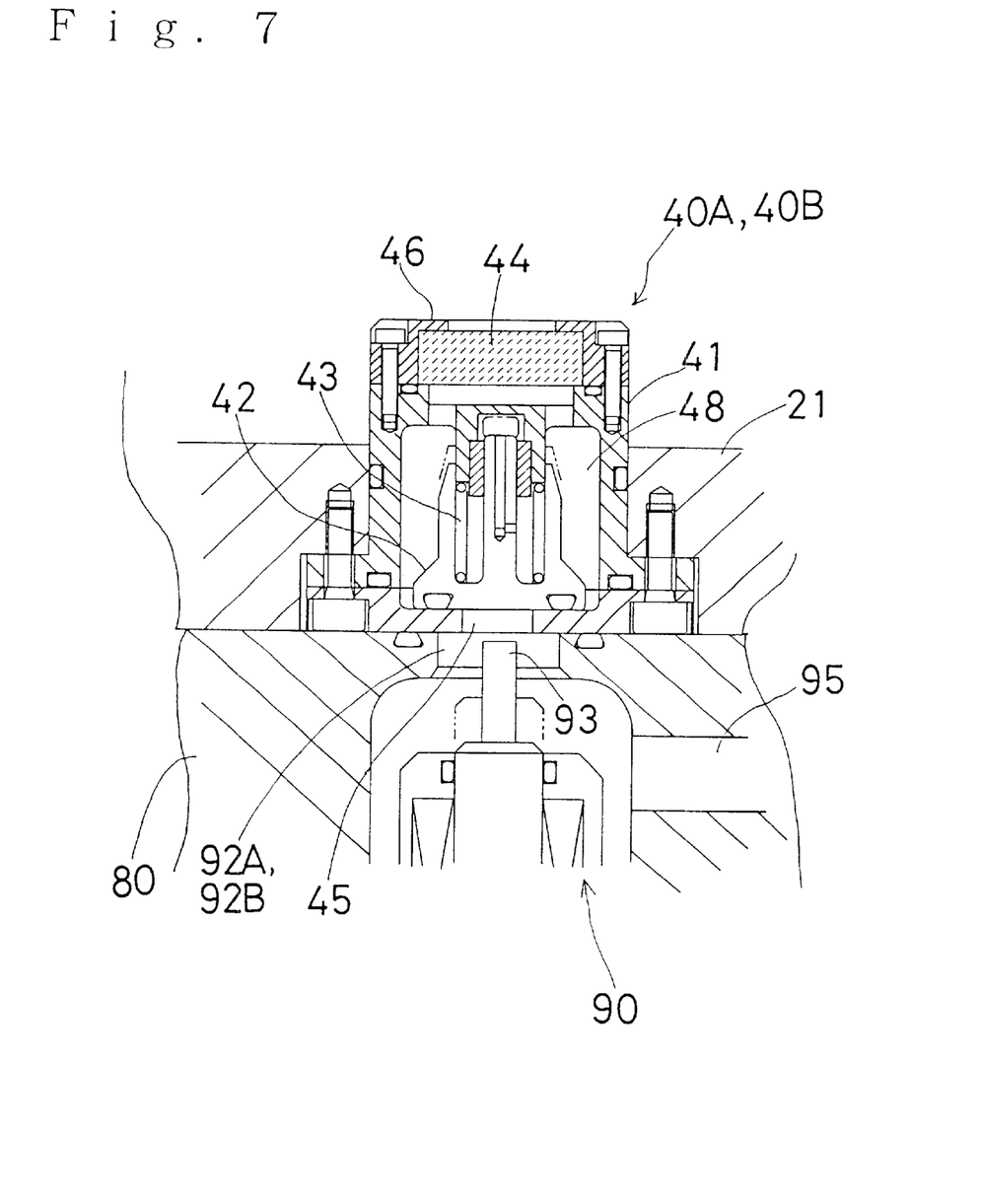
FIG. 7 is an enlarged sectional view of the part around a gas inlet/outlet valve in the bottom of the box body.
Figure 8:
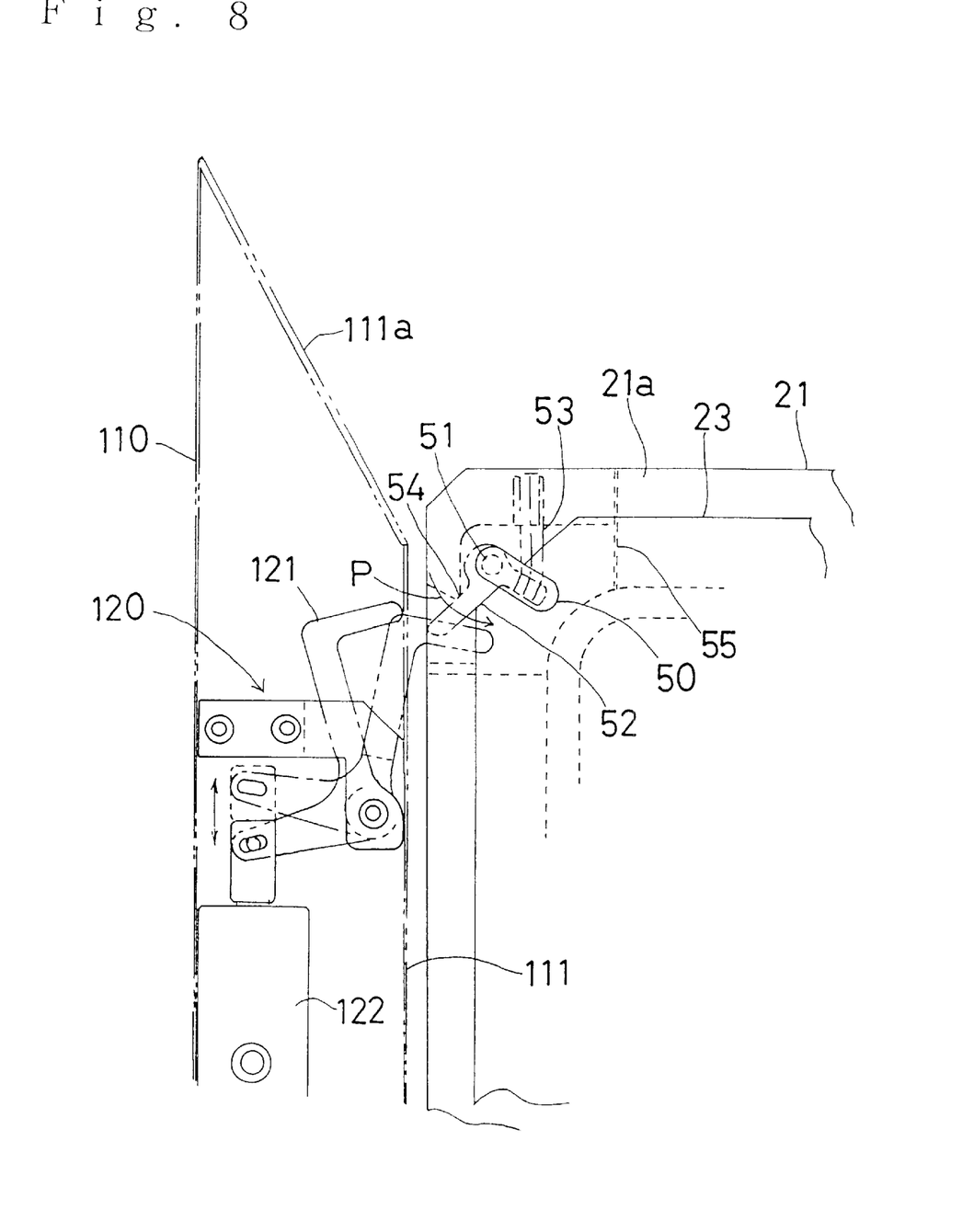
FIG. 8 is an enlarged view to show a box up-and-down guide and latch releasing means of the load port mechanism.

FIG. 1 is a front sectional view of the main part of the clean box and load port mechanism in the embodiment of the present invention, FIG. 2 is a sectional plan view thereof, FIG. 3 is a front sectional view to show the overall structure of the clean box and the clean device having the load port mechanism, FIG. 4 is a sectional side view thereof, FIG. 5 is a perspective view of the clean box, FIG. 6 is an enlarged sectional view to show the structure of the intake/exhaust port for evacuation to effect vacuum suction of the opening/closing lid of the clean box, FIG. 7 is an enlarged sectional view to show the structure of a gas inlet/outlet valve (port) provided in the bottom of the clean box, and FIG. 8 is a front view to show an enlarged latch part of the clean box.

First described is the structure of the clean box. As illustrated in FIG. 2, FIG. 4, FIG. 5, and FIG. 6, the clean box 20 is composed of a box body 21 having a side aperture 22 in one side surface, and an opening/closing lid 23 for hermetically closing the side aperture 22. A portion around the side aperture 22 of the box body 21 is a side flange portion 21a and an annular groove 24 for suction surrounding the side aperture 22 is formed so as to make a round in an opposite surface of the side flange portion 21a to the opening/closing lid (a joint surface to the opening/closing lid). As illustrated in FIG. 6, an intake/exhaust port 26 is provided on the bottom side of the box body 21 so as to be in communication through an intake/exhaust passage 25 with the annular groove 24 for suction. While being mounted on the box body 21, the opening/closing lid 23 hermetically covers the annular groove 24 to form a space S for suction. When the suction space S is evacuated through the intake/exhaust port 26 and the intake/exhaust passage 25, the opening/closing lid 23 is sucked to the box body 21 by a pressure difference between inside and outside thereof to hermetically close the side aperture 22. An engagement portion 29 for holding is integrally formed on an upper surface of the box body 21.

A mechanism around an additional lid 27 is illustrated in FIG. 1 and FIG. 6. The additional lid 27 functions to hermetically close the aforementioned intake/exhaust port 26 by the pressure difference between inside and outside thereof and the box body 21 is provided with drop preventing means 30 for preventing a drop of the additional lid 27.

Further, gas inlet/outlet valves (ports) 40A, 40B for introduction of a non-oxidizing gas are provided in the bottom of the box body 21, as illustrated in FIG. 2. Here, the gas inlet/outlet valves (ports) 40A, 40B for introduction of the non-oxidizing gas (nitrogen gas, an inert gas, or the like)

have the same structure, either one being used as a gas feed valve while the other as a gas discharge valve.

As described above, the clean box 20 is of the structure having airtightness enough to maintain the clean state during periods of closing of the opening/closing lid 23 and additional lid 27 and having neither the evacuation means nor the transfer means.

As seen from FIG. 2, the intake/exhaust port 26 for vacuum suction of the opening/closing lid 23 to the box body 21 is positioned in the center of the bottom of the box body 21. In order to locate the intake/exhaust port 26 at a recessed position from the bottom surface of the box body 21, a circular recess 31 in communication with the intake/exhaust passage 25 is formed in a thick part of the bottom of the box body 21, as illustrated in FIG. 6, a cyclindrical member 32 with a flat upper end surface is fixed with screws so as to cover the circular recess 31, and the intake/exhaust port 26 is formed in the center of the upper end surface of the cyclindrical member 32 with the upper end surface. The additional lid 27 for closing the intake/exhaust port 26 incorporates an integral engagement portion 35 on the bottom side (on the back side), the engagement portion 35 being composed of a shaft portion 36 and a large diameter portion (or a wide portion) 37 fixed to a lower end thereof. The shaft portion 36 integral with the additional lid 27 is supported vertically slidably by a stationary support member 33 fixed with screws to the box body 21 so as to surround (or cover) the intake/exhaust port 26. A coil spring (compression spring) 39 is set around the shaft portion 36 so as to press and urge the additional lid 27 toward the intake/exhaust port 26. The stationary support member 33 is provided with vent holes 33a.

As shown in FIG. 2 and FIG. 6, the annular groove 24 and the intake/exhaust port 26 are connected to each other through the intake/exhaust passage 25 and the inside of circular recess 31 formed inside the thick part of the bottom of the box body 21.

For assuring airtightness, an O-ring for hermetic sealing is set in each of the inside periphery and the outside periphery of the annular groove 24 for suction in the opposite surface of the opening/closing lid 23 in contact with the side flange portion 21a of the box body 21. Further, an O-ring for hermetic sealing is provided in a surface of the cylindrical member 32 with the upper end surface opposite to the bottom surface of the box body 21, as illustrated in FIG. 6, and an O-ring for hermetic sealing to assure airtightness is also provided in an opposite surface of the additional lid 27 in contact with the peripheral part of the intake/exhaust port 26.

As illustrated in FIG. 7, the gas inlet/outlet valves 40A, 40B used for introduction of the non-oxidizing gas into the clean box 20 have the same structure, each valve incorporating a metal valve body 42 of stainless steel or the like, a coil spring 43 as a compression spring, and a filter 44 for removal of dust in a cylinder structure 41 of a metal such as stainless steel or the like. The cylinder structure 41 has a small aperture 45 for intake/exhaust of gas in the bottom part and a filter mount portion 46 opening in the upper part, and the filter 44 for removal of dust is set in the filter mount portion 46. The metal valve body 42 is urged in such a direction as to close the small aperture 45 for intake/exhaust of gas by the coil spring 43. The metal cylinder structure 41 enclosing the metal valve body 42, the coil spring 43, and the filter 44 for removal of dust as described above is fixed with screws in fitting holes 47 of the box body 21 and the inside of the metal cylinder structure 41 forms a gas intake/exhaust passage 48 running from the small aperture 45 for intake/exhaust of gas via the filter 44 for removal of dust to the inside space of the box body 21. The filter 44 for removal of dust provided in the gas intake/exhaust passage 48 functions to prevent the dust and fine particles from entering the inside of the clean box 20.

For hermetic sealing of the mount portions of the gas inlet/outlet valves 40A, 40B, an O-ring is set in the outside periphery of the metal cylinder structure 41, and an O-ring for hermetic sealing is also set in an opposite surface of the valve body 42 to the peripheral part of the small aperture 45 for intake/exhaust of gas.

A holder 28 for supporting the objects 15 to be transferred, such as the semiconductor wafers or the like, is attached in the box body 21, as illustrated in FIG. 1 and FIG. 5. The holder 28 is constructed, for example, in such structure that many objects 15 to be transferred can be stored at equal intervals in a horizontal state.

Further, in order to avoid an accident of a drop of the opening/closing lid 23 due to a leak of the annular groove 24 for vacuum suction of the opening/closing lid 23, latches 50 shown in FIG. 2, FIG. 5, and FIG. 8 are provided so as to be able to engage the outside surface of the opening/closing lid 23 at its four corners. Each latch 50 is fixed to a pin 51, which is rotatable with respect to the flange portion 21a of the box body 21, and an L-shape lever 52 in an hollow member 55, which is integrally attached to the back surface of the flange portion 21a, is fixed to the pin 51. The L-shape lever 52 is urged into the state illustrated in FIG. 8 by a coil spring 53 as a compression spring in the hollow member 55 (in which the L-shape lever 52 is in contact with an inner wall surface 54 of the hollow member 55) and at this position the latch 50 holds the outside surface of the opening/closing lid 23. Each latch 50 can be unlatched simply by driving the L-shape lever 52 from the lateral side of the flange portion 21a so as to rotate it against the elasticity of the coil spring 53 as indicated by an arrow P of FIG. 8.

As shown in FIG. 1 to FIG. 4, in order to allow the objects 15, such as the semiconductor wafers or the like, to be carried into a clean room 60 as a clean device by use of the clean box 20 or to allow the objects 15 to be carried into the clean box 20, there are a gate aperture (entrance/exit) 71 and a load port mechanism (vacuum changer) 70 provided with a gate valve opening/closing mechanism for opening or closing the gate aperture 71. This load port mechanism 70 constitutes a part of a side wall 61 of the clean room 60, and the gate aperture 71 is thus formed in the side wall 61.

As illustrated in FIG. 4, the gate aperture 71 can be opened or closed by a gate valve 73 of the load port mechanism 70. Specifically, the gate valve 73 functions to open or close the aperture by the gate valve opening/closing mechanism and the gate valve 73 is fixed to a fitting arm 74 set behind it. The arm 74 is supported so as to be pivoted on a pivot fulcrum shaft 75 on an up-and-down slider 76. A pneumatic cylinder 77 for pivoting the arm 74 is mounted on this up-and-down slider 76 and the up-and-down slider 76 is arranged to be driven up and down by a vertical rodless cylinder 78 inside the load port mechanism 70 (inside the clean room 60). Here, the gate valve 73 is driven in such a way that it is pivoted by the pneumatic cylinder 77 at the upper limit position of the up-and-down slider 76 to open or close the gate aperture 71. For assuring airtightness, an O-ring for hermetic sealing is provided in an opposite surface of the gate valve 73 in contact with the peripheral part of the gate aperture 71. This gate valve 73 is provided with function of vacuum suction of the opening/closing lid 23 of the clean box 20.

The load port mechanism 70 is equipped with an evacuation means and a gas feeding/discharging mechanism 90, shown in FIG. 1, for guiding a non-oxidizing gas (nitrogen gas, an inert gas, or the like) into the clean box 20 in order to evacuate the inside of the annular groove 24 through the intake/exhaust port 26 of FIG. 2 and FIG. 6 for the purpose of vacuum suction of the opening/closing lid 23 to the box body 21 of the clean box 20 or to return the inside of the annular groove 24 to the atmospheric pressure. Further, the load port mechanism 70 has a load port table (moving table) 80 for holding the clean box 20 at a height suitable for connection to the gate aperture 71 so that the load port table 80 can be slid horizontally (in directions along an arrow R in FIG. 2 and FIG. 4). Specifically, as illustrated in FIG. 1, the load port table 80 is attached via horizontal sliders 82 to a fixed base 81 of the load port mechanism 70, so that it can be moved horizontally in the range from a box connection position where it is close to the gate aperture 71 formed in the side wall 61 of the clean room 60, to a standby position where it is apart therefrom.

As illustrated in FIG. 1, a hook arm member 84, which is a forced opening mechanism (an engagement member on the load port mechanism side) for forcedly separating the additional lid 27 from the intake/exhaust port 26 of the box body 21, is fixed, as illustrated in FIG. 2, at an upper end of an up-and-down rotational shaft 83 vertically penetrating the inside central part of the load port table 80. This hook arm member 84 can engage (or can be hooked on), as indicated by fictitious lines of FIG. 6, the engagement portion 45 composed of the shaft portion 46 and the large diameter portion (or wide portion) 47 integrally formed with the additional lid 27 and can be disengaged therefrom by rotating the up-and-down rotational shaft 83. The up-and-down rotational shaft 83 is arranged to be driven up and down by a cylinder 86 for up-and-down operation.

In the clean box mount surface of the load port table 80, as shown in FIG. 2, there are positioning pins 85 at plural positions and an annular groove for vacuum suction of the bottom surface of the clean box 20 so as to be able to suck and hold the clean box 20 mounted thereon. The positioning pins 85 are fitted in positioning recesses (not illustrated) formed in the bottom surface of the clean box 20.

In an outside opposite surface of the load port mechanism 70 in contact with the side flange portion 21a of the clean box 20 (the peripheral part of the side aperture 22), an O-ring for hermetic sealing surrounding the gate aperture 71 is provided for assuring airtightness.

Further, as illustrated in FIG. 1 and FIG. 7, the gas feeding/discharging mechanism 90 incorporated in the load port mechanism 70 has gas feed/discharge ports 92A, 92B corresponding to the two gas inlet/outlet valves 40A, 40B of the clean box 20 sucked and held on the load port table 80, as illustrated in FIG. 2, in the mount surface of the load port table 80 for mounting the clean box 20, and push pins 93 which can be projected out of the gas feed/discharge ports 92A, 92B. Each push pin 93 is arranged to be driven up and down by an up-and-down driving mechanism 94 such as an electromagnetic plunger, an air cylinder, or the like of FIG. 1. The load port table 80 is provided with gas feed/discharge passages 95 in communication with the gas feed/discharge ports 92A, 92B, respectively.

When the inside of the clean box 20 is replaced with the clean non-oxidizing gas (the nitrogen gas, the inert gas, or the like), each of the push pins 93 of the gas feed/discharge ports 92A, 92B is moved up by the up-and-down driving mechanism 94 to push up the valve body 42 on the side of the gas inlet/outlet valve 40A, 40B to open the small aperture 45 for intake/exhaust of gas and in this state the non-oxidizing gas is supplied through one gas feed/discharge port 92A to be introduced through the gas inlet/outlet valve 40A into the clean box 20. At the same time as it, the gas having filled the clean box before the introduction of the non-oxidizing gas is discharged via the gas inlet/outlet valve 40B and the gas feed/discharge port 92B from the other gas feed/discharge passage. After the gases are allowed to flow for a fixed time, the push pins 93 of the gas feed/discharge ports 92A, 92B are moved down by the up-and-down driving mechanism 94 to close the valve bodies 42 of the respective gas inlet/outlet valves 40A, 40B.

As illustrated in FIG. 1 and FIG. 3, in order to allow the clean box 20 held by the OHT 100 to be mounted smoothly on the load port table 80 of the load port mechanism 70, box up-and-down guides 110 made of cold finished stainless steel or the like with little friction are fixed at positions on either side of the gate aperture 71 on the front surface of the load port mechanism 70 (outside the side wall surface of the clean room). The pair of box up-and-down guides 110 have respective guide surfaces 111 opposed to each other at a spacing a little larger than the lateral width of the flange portion 21a of the clean box 20, and upper portions of the guide surfaces 111 are formed as taper surfaces 111a with increasing spacing upward.

The inside of the box up-and-down guides 110 is hollow and inside each guide there is latch releasing means 120 for releasing each latch 50 on the clean box 20 side, as illustrated in FIG. 1 and FIG. 8. The latch releasing means 120 is composed of releasing levers 121 journaled on the outside surface of the load port mechanism 70, and an air cylinder 122 connected to one end of the releasing levers 121 and arranged to pivot the releasing levers 121. In this example the air cylinder 122 is arranged to drive the two releasing levers 121 simultaneously.

As illustrated in FIG. 5, an aperture 125 for unlatching is formed in a side surface of each hollow member 55 fixed to the flange portion 21a of the clean box 20 and each latch 50 can be unlatched by simply sticking the tip of the releasing lever 121 into the aperture 125 to rotate the L-shape lever 52 against the elasticity of the coil spring 53 as indicated by the arrow P of FIG. 8. This pivots the latch 50 from the position where it holds the opening/closing lid 23 to the position where it releases the opening/closing lid 23.

Next, the overall operation of this embodiment will be described with an example in which the clean box 20 is transferred by the OHT.

When the clean box 20 held at the engagement portion 29 for holding by the OHT 100 is transferred to the position immediately above the load port table 80 of the load port mechanism 70 (or above the standby position apart from the gate aperture 71 as indicated by a fictitious line Q in FIG. 2 and FIG. 4), as illustrated in FIG. 3, the clean box 20 is lowered by the OHT 100 to be mounted on the load port table 80 while being guided by the guide surfaces 111 of the box up-and-down guides 110 on the both sides of the gate aperture 71, whereupon the positioning pins 85 of FIG. 2 in the mount surface of the load port table 80 become fitted in the positioning recesses of the clean box 20. At this time, since the upper portions of the guide surfaces 111 are the taper surfaces 111a with increasing spacing upward, the clean box 20 is accurately moved down onto the load port table 80 while being guided smoothly by the guide surfaces 111.

After the clean box 20 is mounted as being positioned on the load port table 80, the clean box 20 is vacuum-sucked to the load port table 80 and in this holding state of the clean box 20 the load port table 80 is moved toward the side wall 61 of the clean room 60 up to the box connection position to make the side flange portion 21a of the box body 21 hermetically pressed against the outside surface of the side wall 61 in the peripheral part of the gate aperture 71. At this time the opening/closing lid 23 moves into the gate aperture 71 to go into close fit to the gate valve 73 hermetically closing the gate aperture 71 and the opening/closing lid 23 is sucked to and held on the side of the gate valve 73, too.

When the clean room 60 is in the clean non-oxidizing gas (the nitrogen gas, the inert gas, or the like) ambient, the inside of the clean box 20 needs to be preliminarily filled with the clean non-oxidizing gas. If the inside of the clean box 20 is vacant and is not filled with the non-oxidizing gas (the nitrogen gas, the inert gas, or the like), each of the push pins 93 of the gas feeding/discharging mechanism 90 shown in the lower part of FIG. 1 is moved up to open the two gas inlet/outlet valves 40A, 40B as illustrated in FIG. 2, so as to introduce the clean non-oxidizing gas through one gas inlet/outlet valve 40A into the clean box and discharge the gas inside the clean box 20 through the other gas inlet/outlet valve 40B, thereby replacing the inside of the clean box 20 with the non-oxidizing gas in the fixed time.

Then the inside space U of the load port table 80, the upper surface of which is hermetically closed by the clean box 20, is evacuated to cancel the pressure difference between inside and outside of the additional lid 27 (the inside of the intake/exhaust port 26 and the inside space U both becoming vacuum) to turn the additional lid 27 into an openable state and, as indicated by the fictitious lines of FIG. 1, FIG. 2, and FIG. 6, the up-and-down rotational shaft 83 is rotated to hook the hook arm member 84 on the engagement portion 35 of the additional lid 27. Then the up-and-down rotational shaft 83 is moved down. This pulls the additional lid 27 down against the elasticity of the coil spring 39 to open the intake/exhaust port 26 on the bottom side of the box body 21.

Next, the inside space U of the load port table 80 is injected with clean gas such as clean air, nitrogen, or the like (preferably, the non-oxidizing gas) to return the inside space U, the inside of the intake/exhaust port 26 of the clean box 20 in communication therewith, and the inside of the annular groove 24 in communication therewith to the atmospheric pressure. This releases the vacuum suction of the opening/closing lid 23 (the inside of the suction annular groove 24 and the clean room 60 both becoming the atmospheric pressure). At the same time as it, or before or after it, the releasing levers 121 of the latch releasing means 120 are actuated by the air cylinders 122 to stick the tips of the releasing levers 121 into the apertures 125 for unlatching on the side of the flange portion 21a of the box body illustrated in FIG. 5, thereby pivoting the L-shape levers 52 so as to release the latches 50 from the opening/closing lid 23.

According to these operations, the opening/closing lid 23 becomes sucked and held only by the gate valve 73, and then the fitting arm 74 is pivoted clockwise by the pneumatic cylinder 77 of the gate valve opening/closing mechanism to separate the gate valve 73 from the gate aperture 71 as indicated by fictitious lines J of FIG. 4. Then the up-and-down slider 76 is moved down to the position of fictitious lines K of FIG. 4. As a consequence, the opening/closing lid 23 is pulled into the clean room 60, whereby the gate aperture 71 is opened. In this state the inside of the clean box 20 and the clean room 60 compose a continuous space of the non-oxidizing gas (the nitrogen gas, the inert gas, or the like) ambient, so that the objects 15 to be transferred can be transferred successively horizontally onto the vacant holder 28 of the clean box 20 by a carry robot or the like provided on the clean room 60 side, whereby the desired number of objects 15 to be transferred can be stored in the clean box 20.

After the desired number of objects 15 to be transferred are carried into the clean box 20, the gate valve opening/closing mechanism is actuated to press the gate valve 73 against the inside peripheral part of the side wall 61 having the gate aperture 71, whereby the gate aperture 71 is hermetically closed and whereby the opening/closing lid 23 under vacuum suction by the gate valve 73 is pressed against the side flange portion 21a of the box body 21. In the state in which the side aperture 22 of the clean box 20 is hermetically closed by the opening/closing lid 23, the additional lid 27 is opened by the hook arm member 84 as indicated by the fictitious lines of FIG. 2 and FIG. 6 to evacuate the inside space U of the load port table 80 of FIG. 1 and the inside of the annular groove 24 of the clean box 20 (the inside of the space S for suction) in communication therewith through the intake/exhaust port 26. After completion of the evacuation, the engagement is disengaged between the hook arm member 84 and the engagement portion 35 of the additional lid 27 to make the additional lid 27 pressed against the intake/exhaust port 26 by the elasticity of the coil spring 39 as illustrated in FIG. 6. At the same time as it, or before or after it, the releasing levers 121 of the latch releasing means 120 are drawn into the box up-and-down guides 110 to make the latches 50 hold the outside surface of the opening/closing lid 23. After that, the inside space U of the load port table 80 is injected with clean gas such as the clean air, nitrogen, or the like (preferably, the non-oxidizing gas) to return the inside space U to the atmospheric pressure, whereby the opening/closing lid 23 and the additional lid 27 come to hermetically seal the side aperture 22 and the intake/exhaust port 26 with certainty by the pressure difference between inside and outside, because the inside of the annular groove 24 and the intake/exhaust port 26 of the clean box 20 is the vacuum while the outside is the atmospheric pressure. Then the suction of the opening/closing lid 23 by the gate valve 73 is released, the load port table 80 is moved away from the gate aperture 71, and the suction of the clean box 20 on the load port table 80 side is released, whereupon the clean box 20 becomes free to carry alone. Therefore, the clean box 20 can be transferred to an arbitrary position by an automatic guided vehicle or the like.

If the clean room 60 is in the clean gas ambient but not in the non-oxidizing gas ambient, the operation will be carried out as follows; the objects to be transferred are transferred into the clean box 20, the opening/closing lid 23 is closed to effect the vacuum suction, and thereafter the inside of the clean box 20 is replaced with the clean non-oxidizing gas by the gas feeding/discharging mechanism 90 incorporated in the load port mechanism 70.

The embodiment described above has the following effects.

(1) Since the opening/closing lid 23 undergoes the vacuum suction in the structure in which the annular groove 24 for suction, which can be evacuated through the intake/exhaust port 26 formed in one surface except for the aperture surface, is formed in the side open surface of the box body 21 of the clean box 20, the adhesion of the opening/closing lid 23 is higher than in the case of the simple mechanical seal, whereby the side aperture 22 for transfer of the objects to be transferred can be hermetically closed by the opening/closing lid 23 while the intake/exhaust port 26 by the additional lid 27. Since the outer surface of the opening/closing lid 23 is always held by the latches 50 provided at the plural positions on the flange portion 21a and since the additional lid 27 is also always urged toward the closing state by the coil spring 39 of the drop preventing means 30, the opening/closing lid 23 and additional lid 27 will be prevented from dropping even in the event of a leak in the suction part between the annular groove 24 for suction and the opening/closing lid 23. This facilitates handling of the clean box 20.

(2) Since the load port mechanism 70 has the box up-and-down guides 110 on either side of the gate aperture 71, as guides during the up-and-down operation of the clean box 20 by the OHT 100 as illustrated in FIG. 3 and FIG. 4, the clean box 20 can be lowered smoothly and accurately onto the load port table 80. Therefore, the positioning recesses on the clean box 20 side can be readily fitted onto the positioning pins 85 of FIG. 2 on the mount surface of the load port table 80, which can facilitate the positioning between them.

(3) Since the latch releasing means 120 for unlatching the latches 50 on the clean box 20 are provided inside the box up-and-down guides 110, the latch releasing means 120 can be compact and the unlatching operation of the latches 50 can be performed from the lateral sides of the flange portion 21a of the box body. Namely, the latches 50 can be unlatched from the positions outside the clean box 20, which are not in the clean space, and the moving locations of the latches 50 are also outside the clean box 20. This prevents the clean space composed of the clean box 20 and the clean room 60 from being contaminated with the latching and unlatching operations of the latches 50. The dust can be prevented from attaching to the objects 15 to be transferred, such as the semiconductor wafers or the like, accordingly.

(4) While the clean box 20 is mounted on the load port mechanism 70, the gas feeding/discharging mechanism 90 incorporated in the load port mechanism 70 can automatically introduce and charge the non-oxidizing gas such as the nitrogen gas, the inert gas, or the like through the gas inlet/outlet valves 40A, 40B into the clean box 20. On that occasion, use of the non-oxidizing gas such as the nitrogen gas, the inert gas, or the like involves the risk of the oxygen-deficient accident, but safety can be assured, because the inside of the clean box 20 can be replaced with the non-oxidizing gas in the perfect, hermetically closed state.

(5) The filters 44 for removal of dust are provided in the gas feed/discharge passages 48 running from the small aperture 45 for intake/exhaust of gas in the gas inlet/outlet valves 40A, 40B to the inside space of the box body 21, whereby the dust and fine particles are prevented from entering the inside of the clean box 20 during the introduction of the non-oxidizing gas.

For the mechanism for opening or closing the gate aperture 71 of the clean room 60 by the gate valve 73, an appropriate configuration can be employed out of various configurations in order to accomplish its purpose.

The embodiment of the present invention was described above, but it is apparent to those skilled in the art that the present invention is not limited to the embodiment but can embrace various modifications and changes within the spirit and scope of the appended claims.

What is claimed is:

1. A clean box comprising:
    a box body having an aperture in a first side surface for any one of transferring an object through said box body and storing an object in said box body;
    a removably detachable opening/closing lid for hermetically closing said aperture in said first side surface of said box body while a vacuum suction is applied to said box body at an annular suction space formed between said box body and said removably detachable opening/closing lid by said opening/closing lid hermetically covering an annular groove for suction, said annular groove for suction surrounding an outer boundary of said aperture; and
    a plurality of latches provided on said box body, said plurality of latches engaging said removably detachable opening/closing lid outside said box body when said removably detachable opening/closing lid is supported over said aperture in said first side surface of said box body to close said box body.

2. The clean box according to claim 1, wherein said plurality of latches can be unlatched from outer and lateral sides of said box body, said outer and lateral sides of said box body being side positions with respect to said first side surface having said aperture.

3. The clean box according to claim 1, further comprising an intake/exhaust port in communication with said annular groove, provide in another surface.

4. The clean box according to claim 1, wherein said box body comprises a gas inlet valve and a gas outlet valve.

5. A clean transfer method comprising steps of:
    preparing a clean box comprising a box body having an aperture in a first side surface for any one of transferring an object through said box body and storing an object in said box body, a removably detachable opening/closing lid for hermetically closing said aperture in said first side surface of said box body while a vacuum suction is applied to said box body at an annular suction space formed between said box body and said removably detachable opening/closing lid by said opening/closing lid hermetically covering an annular groove for suction, said annular groove for suction surrounding an outer boundary of said aperture, and a plurality of latches provided on said box body, said plurality of latches engaging said removably detachable opening/closing lid outside said box body when said removably detachable opening/closing lid is supported over said aperture in said first side surface of said box body to close said box body;
    preparing a clean device in which a gate aperture formed in a side wall surface is hermetically closed by a gate valve, said clean device comprising box up-and-down guides and latch releasing means on both sides of said gate aperture outside said side wall surface and further comprising a moving table below said gate aperture and outside said side wall surface;
    mounting said clean box on said moving table by lowering said clean box while guiding said clean box by said up-and-down guides of said clean device; and
    hermetically connecting said clean box to said gate aperture of said clean device by movement of said moving table, thereafter unlatching said latches of said latch releasing means, releasing said vacuum suction of said opening/closing lid, together with said gate valve, into said clean device to establish communication between said inside space of said clean box and an inside of said clean device, and transferring said object between said clean box and said clean device.

6. A clean transfer apparatus comprising:
    a clean box comprising a box body having an aperture in a first side surface, a removably detachable opening/ closing lid for hermetically closing said aperture in said first side surface of said box body while a vacuum suction is applied to said box body at an annular suction space formed between said box body and said removably detachable opening/closing lid by said opening/closing lid hermetically covering an annular groove for suction, said annular groove for suction surrounding an outer boundary of said aperture, and a plurality of latches provided on said box body, said plurality of latches engaging said removably detachable opening/closing lid outside said box body when said removably detachable opening/closing lid is supported over said aperture in said first side surface of said box body to close said box body; and a clean device comprising a gate aperture formed in a side wall surface, a gate valve for any one of opening and closing said gate aperture and holding said removably detachable opening/closing lid of said clean box connected to said gate aperture, box up-and-down guides, and latch releasing means provided on both sides of said gate aperture outside said side wall surface, and a moving table provided below said gate aperture and outside said side wall surface, wherein said box up-and-down guides are guides for guiding said clean box any one of while said clean box is lowered onto said moving table and while said clean box is moved up and away from said moving table, and said latch releasing means are means for unlatching said latches from outer and lateral sides of said box body, and wherein in a state in which said clean box is connected to said gate aperture, said latches are unlatched by said latch releasing means, said vacuum suction applied to said box body is released, and said removably detachable opening/closing lid, together with said gate valve, is drawn into said clean device to establish communication between an inside space of said clean box and an inside of said clean device.

7. The clean transfer apparatus according to claim 6, wherein said box up-and-down guides also serve as covers for covering said latch releasing means.

\* \* \* \* \*